(12) United States Patent
Terashima et al.

(10) Patent No.: US 6,838,745 B1
(45) Date of Patent: *Jan. 4, 2005

(54) SEMICONDUCTOR DEVICE HAVING A SEPARATION STRUCTURE FOR HIGH WITHSTAND VOLTAGE

(75) Inventors: Tomohide Terashima, Tokyo (JP); Kazuhiro Shimizu, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 168 days.

(21) Appl. No.: 09/041,105

(22) Filed: Mar. 12, 1998

(30) Foreign Application Priority Data

Sep. 18, 1997 (JP) .............................................. 9-253248

(51) Int. Cl.⁷ .............................................. H01L 23/58
(52) U.S. Cl. ........................ 257/492; 257/493; 257/526; 257/546; 257/549; 257/552
(58) Field of Search ................................ 257/492, 493, 257/526, 409, 552, 544, 546, 549, 551, 370

(56) References Cited

U.S. PATENT DOCUMENTS

| | | | | |
|---|---|---|---|---|
| 3,971,059 A | * | 7/1976 | Dunkley et al. ............. | 257/549 |
| 4,292,642 A | | 9/1981 | Appels et al. | |
| 4,314,268 A | * | 2/1982 | Yoshioka et al. ............ | 257/544 |
| 4,484,388 A | * | 11/1984 | Iwasaki ........................ | 29/571 |
| 4,644,383 A | * | 2/1987 | Akcasu ........................ | 357/50 |
| 4,994,888 A | * | 2/1991 | Taguchi et al. ............... | 357/43 |
| 4,997,775 A | * | 3/1991 | Cook et al. .................... | 437/31 |
| 5,011,784 A | * | 4/1991 | Ratnakumar ................. | 257/370 |
| 5,031,019 A | | 7/1991 | Kosaka et al. | |
| 5,151,382 A | | 9/1992 | Josquin et al. | |
| 5,286,986 A | * | 2/1994 | Kihara et al. ................ | 257/215 |
| 5,330,922 A | | 7/1994 | Erdeljac et al. | |
| 5,376,816 A | * | 12/1994 | Nishigoori et al. ......... | 257/370 |
| 5,455,447 A | * | 10/1995 | Hutter et al. ................ | 257/545 |
| 5,532,508 A | * | 7/1996 | Kaneko et al. .............. | 257/336 |
| 5,789,288 A | * | 8/1998 | Palmieri et al. ............. | 438/234 |

FOREIGN PATENT DOCUMENTS

| | | | | |
|---|---|---|---|---|
| JP | 359126662 | * | 7/1984 | ................. 257/544 |
| JP | 362026852 | * | 2/1987 | ................. 257/544 |
| JP | 364081352 | * | 3/1989 | ................. 257/370 |
| JP | 4-137563 | | 9/1990 | |
| JP | 405283629 | * | 10/1993 | ................. 257/544 |

* cited by examiner

Primary Examiner—Ori Nadav
(74) Attorney, Agent, or Firm—McDermott Will & Emery LLP

(57) ABSTRACT

An n-type well is formed in a p⁻-type semiconductor substrate and a p⁻-type epitaxial layer is formed on; the n-type well. An n⁻-type well is formed in the, p-type epitaxial layer on the n-type well so as to allow a RESURF operation. A p-type island is formed in the n⁻-type well at a position above the n-type well to form an island region for high withstand-voltage separation. Thus, the withstand voltage of the separated island is improved.

3 Claims, 11 Drawing Sheets

SEMICONDUCTOR DEVICE HAVING A SEPARATION STRUCTURE FOR HIGH WITHSTAND VOLTAGE

TECHNICAL FIELD

This invention relates to a high voltage semiconductor device or a semiconductor device having a separation structure for high withstand-voltage operation.

BACKGROUND ART

FIG. 9 is a cross-sectional view of an island region using a RESURF structure of high withstand-voltage in a conventional high withstand-voltage semiconductor device. FIG. 9(a) is a sectional view and FIG. 9(b) is a plan view of the structure. FIG. 9(a) shows the sectional structure taken along the dashed line of FIG. 9(b).

In FIG. 9, reference numeral 1 indicates a p⁻-type semiconductor substrate. Reference numeral 2 indicates an n-type well. Reference numeral 4 indicates an n⁻-type well. Reference numeral 5 indicates a p-type island formed on the surface of the n-type well 2, which serves as a back gate region of an nchMOS transistor.

The n⁻-type well 4 is used to obtain a high withstand voltage. When a high voltage is applied to the n-type well 2, the n⁻-type well 4 is virtually depleted so as to relax a surface electric field. This is a technique generally known as a RESURF operation (see, for example, U.S. Pat. No. 4,292,642 as to a RESURF structure).

When a high potential island region is formed in such a construction, the following problems arise.

A first problem is that if then-type well 2 is not formed much deeper, then a depletion layer extending from the p⁻-type semiconductor substrate 1 reaches the p-type island 5 to thereby produce punch-through, whereby the entire withstand voltage is limited by the punch-through.

A second problem is that when an element or device such as a vertical npn-Tr, a vertical nch-DMOS or the like, using the n-type well 2 itself as an electrode is formed in the n-type well 2, the resistance of a portion equivalent to the n-type well 2 becomes large and hence device characteristics deteriorate.

FIG. 10 shows an example in which the vertical npn-Tr is formed in the n-type well 2 shown in FIG. 9. FIG. 10(a) is a cross-sectional view of the example and shows a cross-section taken along the dashed line of the plan view of FIG. 10(b). Thus, when the n-type well 2 itself is used as the electrode, the resistance of a portion equivalent to the n-type well 2 is large and hence device characteristics encounter deterioration.

A third problem is as follows. A method is known in which an island region is partially divided into portions when the above-described BipTr is incorporated into the structure, and a region therebetween of the p⁻-type semiconductor substrate 1 is depleted to thereby ensure separation between elements or devices. However, the surface of the p⁻-type semiconductor substrate 1 is generally low in impurity concentration. Leakage is apt to occur due to n-type reversal, and when a reverse-preventive diffused region is added to the surface to prevent reversal, reduction occurs in island withstand voltage due to the added diffused region.

FIG. 11 shows an example in which the island region shown in FIG. 9 is divided into n-type wells 2a and 2b and a reverse-preventive p-type diffused region 7 is formed in the surface of a p⁻-type semiconductor substrate 1 developed between the divided n-type wells 2a and 2b. FIG. 11(a) is a cross-sectional view of the example and illustrates a cross section taken along the dashed line of the plan view shown in FIG. 11(b). Even in this structure, island withstand-voltage might be reduced in reverse.

DISCLOSURE OF THE INVENTION

The present invention has been made to solve such problems developed in the conventional high withstand-voltage semiconductor device. Thus, the present invention provides a semiconductor device having a high withstand-voltage separation structure capable of controlling punch-through to an island formed within a high withstand-voltage separated island region and lowering a diffused resistance of a lower portion of a vertical device such as a vertical npnTr, a vertical nchDMOS or the like when the vertical device is incorporated in the island region, thereby making it possible to improve the characteristic of the vertical device.

According to one aspect of the present invention, a semiconductor device having a separation structure for high withstand-voltage comprises a first-conduction-type semiconductor substrate and a second-conduction-type well relatively high in impurity density formed on the surface of the first-conduction-type semiconductor substrate. A first-conduction-type epitaxial region is formed on the first-conduction-type semiconductor substrate including the second-conduction-type well. Further, a second-conduction-type well relatively low in impurity density is formed in the first-conduction-type epitaxial region so as to reach the second-conduction-type well relatively high in impurity density in an area including the second-conduction-type well relatively high in impurity density.

According to another aspect of the present invention, a semiconductor device having a separation structure for high withstand-voltage comprises a first-conduction-type semiconductor substrate and first and second second-conduction-type wells relatively high in impurity density, which is formed on a surface of the first-conduction-type semiconductor substrate, disposed with a predetermined distance therebetween. A first-conduction-type epitaxial region is formed on the first-conduction-type semiconductor substrate including the first and second second-conduction-type wells. Further, first and second second-conduction-type wells relatively low in impurity density are formed, spaced a predetermined distance from each other, in the first-conduction-type epitaxial region so as to reach the first and second second-conduction-type wells relatively high in impurity density in an area including at least portions of the first and second second-conduction-type wells relatively high in impurity density. The first and second second-conduction-type wells relatively low in impurity density are formed so as to extend to an outer peripheral portion of the first and second second-conduction-type wells relatively high in impurity density.

According to another aspect of the present invention, a semiconductor device having a separation structure for high withstand-voltage comprises a first-conduction-type semiconductor substrate and a second-conduction-type well relatively high in impurity density, which is formed on a surface of the first-conduction-type semiconductor substrate. A first-conduction-type epitaxial region is formed-on the first-conduction-type semiconductor substrate including the second-conduction-type well. Further, a second-conduction-type well relatively low in impurity density is formed in the first-conduction-type epitaxial region so as to reach the second-conduction-type well relatively high in impurity density in an area including the second-conduction-type well relatively high in impurity density except for a predetermined portion on the second-conduction-type well relatively high in impurity density.

Other and further objects, features and advantages of the invention will appear more fully from the following description.

BEST MODE FOR CARRYING OUT THE INVENTION

Figure 1:
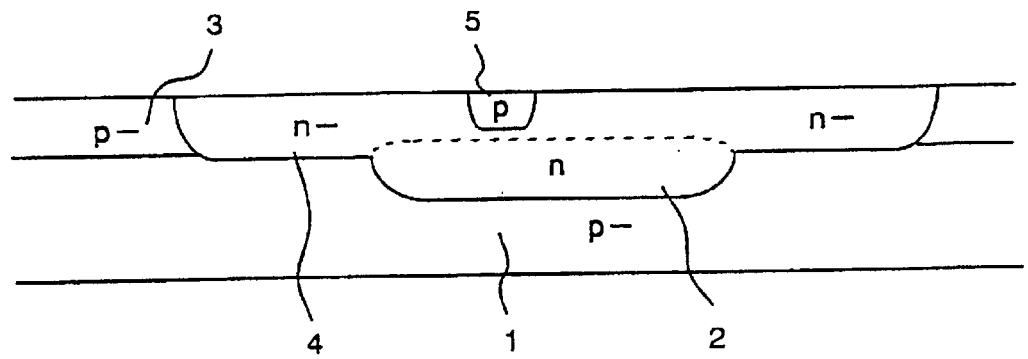
FIG. 1(a) and FIG. 1(b) are a cross-sectional view and a plan view of a structure of a separated island region of a high withstand-voltage employed in a high withstand-voltage semiconductor device according to a first embodiment of the present invention.
Figure 1:
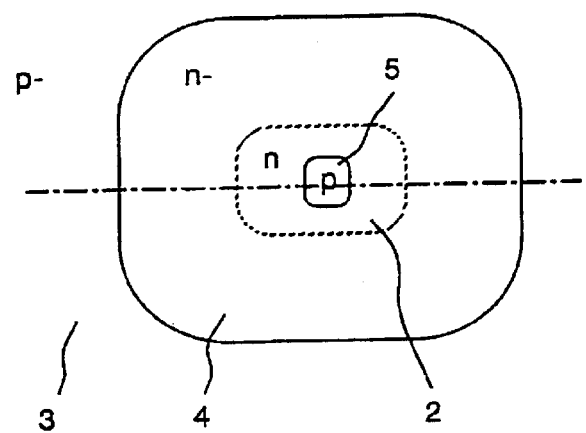

Preferred embodiments of the present invention will hereinafter be described with reference to the accompanying drawings. Incidentally, the same reference numerals in the drawings indicate the same or corresponding portions respectively.

First Embodiment

FIG. 1 is a view showing the structure of a separated island region of a high withstand-voltage employed in a high withstand-voltage semiconductor device according to a first embodiment of the present invention. FIG. 1(a) is a cross-sectional view of the separated island region, and FIG. 1(b) is a plan view thereof. FIG. 1(a) is taken along the dashed line of FIG. 1(b).

In FIG. 1, reference numeral 1 indicates a p$^-$-type semiconductor substrate (i.e. a first conduction type semiconductor substrate). Reference numeral 2 indicates an n-type well (i.e. an n-type buried region or a second conduction type well relatively high in impurity density) formed on the p$^-$-type semiconductor substrate 1. Reference numeral 3 indicates a p$^-$-type epitaxial region (i.e. a first conduction type epitaxial region) formed on the p$^-$-type semiconductor substrate 1 including the n-type well 2. Reference numeral 4 indicates an n-type well (i.e. a second conduction type well relatively low in impurity density) formed in the p$^-$-type epitaxial region 3 including a region for the n-type well 2 and formed to a depth reaching the n-type well 2 and has an area broader than the region for the n-type well 2. Reference numeral 5 indicates a p-type island (i.e. a p-type region) formed on the surface of the n-type well 4 at a portion above the n-type well 2. In this case, the p-type island 5 serves as a back gate region for, for example, an nch MOS transistor.

In such a construction, the n-type well 4 serves so as to obtain a high withstand voltage for this separated island region in accordance with a RESURF operation. Namely, when a high voltage is applied to the p-type island 5, the n-type well 4 is virtually depleted so as to relax the surface electric field, thereby making it possible to provide a high voltage.

In the present embodiment as described above, the p-type epitaxial region 3 is grown on the n-type well 2 to a required thickness. Thereafter, an n-type impurity is diffused or injected into the p$^-$-type epitaxial region 3 within a broad region including an outer peripheral portion of the n-type well 2 to form the n$^-$-type well 4. Next, circuit elements or devices are formed in the n$^-$-type well 4, using the p-type island 5 or the like.

If this construction is taken, then the separated island region can be formed deep by the thickness of the p$^-$-type epitaxial region 3. Therefore, a punch-through voltage between the p$^-$-type semiconductor substrate 1 and, for example, the p-type island 5 can be greatly improved.

Figure 2A:
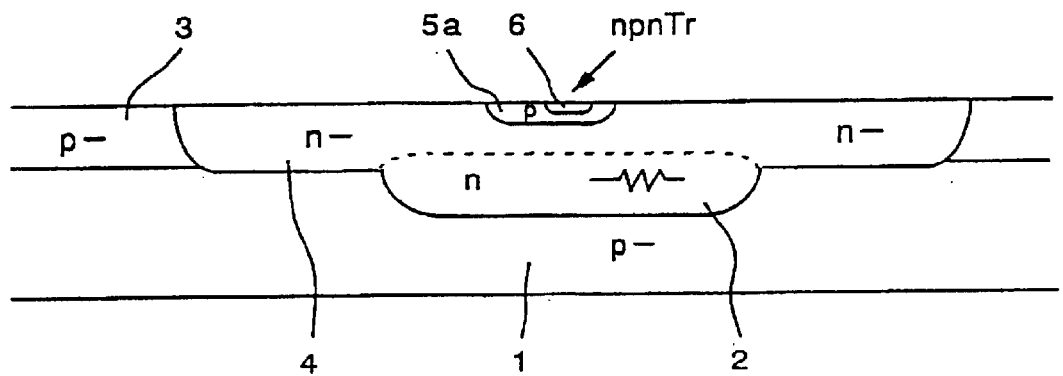
FIG. 2(a) and FIG. 2(b) show a cross-sectional view and a plan view of a vertical npn-Tr on the surface of the structure shown in FIG. 1(a).
Figure 2B:
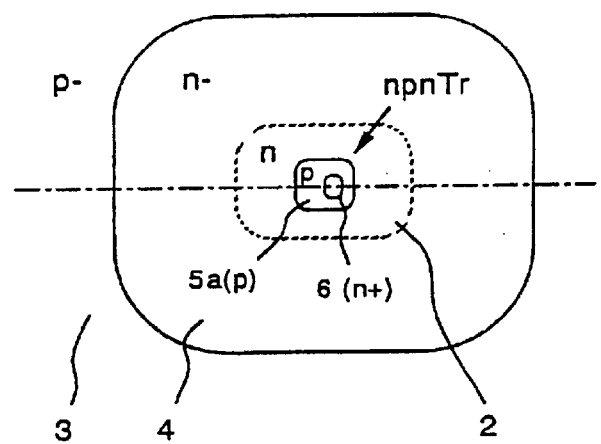

FIG. 2 shows an example in which a base made up of a p-type region 5a and an emitter formed from an n-type diffused region 6 form a vertical npn-Tr on the surface of an n$^-$-type well 4 identical in structure to that shown in FIG. 1. FIG. 2(a) is a cross-sectional view of the example taken along the dashed line of the plan view shown in FIG. 2(b).

By this structure, device characteristics can be improved because a high density region of an n-type well 2 is formed deep beneath the surface. When a vertical nchDMOS or the like is formed as well as the vertical npnTr, device characteristics can be respectively improved in the same manner as described above.

Second Embodiment

Figure 3A:
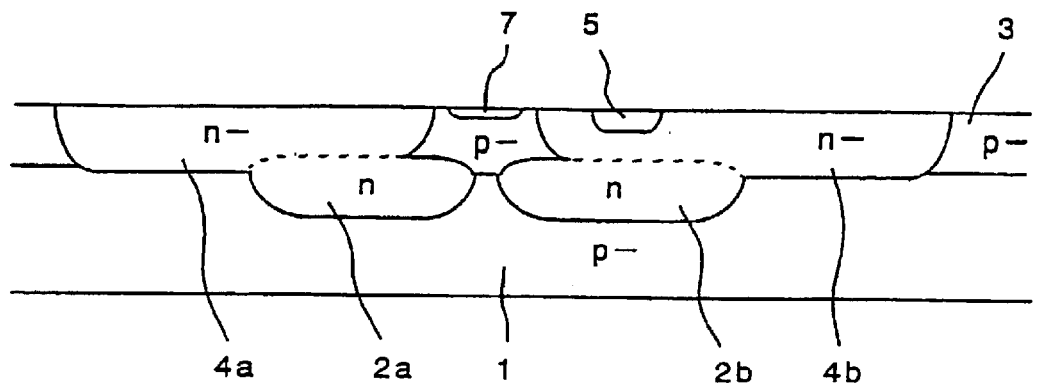
FIG. 3(a) and FIG. 3(b) are a cross-sectional view and a plan view of the structure of a separated island region of a high withstand-voltage employed in a high withstand-voltage semiconductor device according to a second embodiment of the present invention.
Figure 3B:
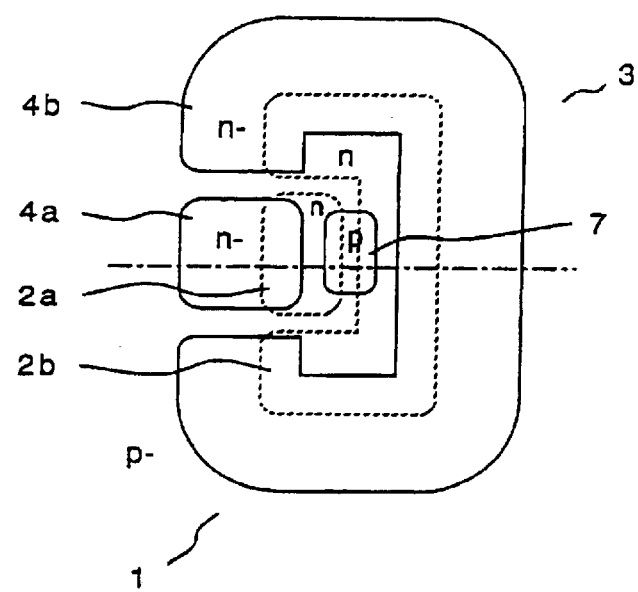

FIG. 3 is a view showing the structure of a separated island region of a high withstand-voltage employed in a high withstand-voltage semiconductor device according to a second embodiment of the present invention. FIG. 3(a) is a cross-sectional view of the separated island region and FIG. 3(b) is a plan view thereof. FIG. 3(a) is taken along a dashed line of FIG. 3(b).

The second embodiment is one in which the island region employed in the first embodiment is divided into partial form. Namely, the n-type well 2 is divided into two parts, which are disposed with a predetermined interval defined therebetween. The n⁻-type well-4 is also divided into two parts, spaced apart from each other and disposed in the form of a ring as a whole so that a p⁻-type epitaxial region 3 appears in the center thereof.

Described more specifically, first and second n-type wells 2a and 2b (i.e. first and second, second conduction type wells relatively high in impurity density) are formed in a p⁻-type semiconductor substrate 1 (i.e. a first conduction type semiconductor substrate) in the high withstand-voltage separation structure. The p⁻-type epitaxial region 3 (i.e. a first conduction type epitaxial region) is formed on the p⁻-type semiconductor substrate 1 including the first and second n-type wells 2a and 2b. Further, first and second n⁻-type wells 4a and 4b (i.e. first and second, second conduction type wells relatively low in impurity density) are formed in the p⁻-type epitaxial region 3 so as to overlap with at least partial regions of the first and second n-type wells 2a and 2b and reach the n-type wells 2a and 2b. The first and second n⁻-type wells 4a and 4b are formed so as to extend to an outer peripheral portion of a region including the first and second n-type wells 2a and 2b as a whole. Namely, the first and second n-type wells 4a and 4b are formed so as to surround the outer peripheries of the first and second n-type wells 2a and 2b as a whole as seen from the plan view of FIG. 3(b). Further, a p-type island 5 (i.e. a p-type region) is formed in the surface of the n⁻-type well 4 at a portion above the n-type well 2.

The first and second n-type wells 2a and 2b are spaced apart from each other by such a distance as capable of obtaining a punch-through voltage above an island withstand voltage.

Further, a reversal-preventive p-type region 7 (i.e. a p-type diffused region or a first conduction-type region relatively high in impurity density) is formed in the surface of the p⁻-type epitaxial region 3 developed between the n⁻-type wells 4a and 4b.

If punch-through is reached between the first and second n-type wells 2a and 2b at a voltage lower than a surface junction withstand voltage between the n⁻-type wells 4a, 4b and the p-type diffused region 7, when a reverse bias is applied between the p⁻-type semiconductor substrate 1 and the island in this construction, then the withstand voltage is not reduced due to the separation structure. Thus, even when the reversal-preventive p-type diffused region 7 is formed in the surface of the p⁻-type epitaxial region 3, a structure capable of preventing the occurrence of a reduction in island withstand voltage can be obtained. Namely, this structure serves to prevent a reduction in withstand voltage at the surface owing to a JFET effect produced between the first and second n-type wells 2a and 2b.

According to the present construction as well, the separated island region can be formed deep by the thickness of the p⁻-type epitaxial region 3. Therefore, the punch-through voltage between the p⁻-type semiconductor substrate 1 and, for example, the p-type island 5 can be greatly improved.

Third Embodiment

Figure 4A:
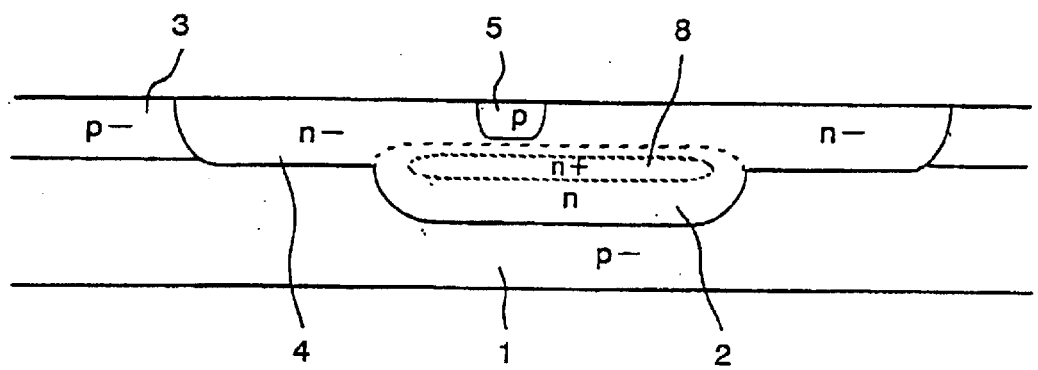
FIG. 4(a) and FIG. 4(b) are a cross-sectional view and a plan view of the structure of a separated island region of a high withstand-voltage employed in a high withstand-voltage semiconductor device according to a third embodiment of the present invention.
Figure 4B:
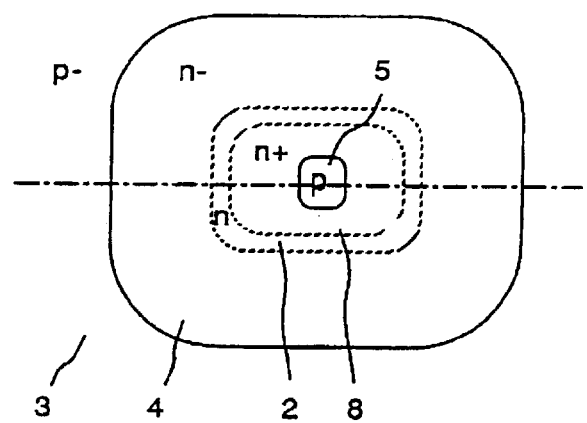

FIG. 4 is a view showing the structure of a separated island region of a high withstand-voltage employed in a high withstand-voltage semiconductor device according to a third embodiment of the present invention. FIG. 4(a) is a sectional view of the separated island region, and FIG. 4(b) is a plan view thereof. FIG. 4(a) is taken along the dashed line of FIG. 4(b).

In FIG. 4, reference numeral 8 indicates an n+-type region (i.e. a second conduction type region higher in impurity density) specifically, an n+buried diffused region, formed inside Van n-type well 2 (i.e. a second conduction type well relatively high in impurity density). Since the present embodiment is identical in other structure to the first embodiment (see FIG. 1), its detailed description will be omitted to avoid duplication.

The present embodiment is constructed in this way, so that the separated island region can be formed deep by the thickness of a p⁻-type epitaxial region 3. Therefore, punch-through voltage between a p⁻-type semiconductor substrate 1 and, for example, a p-type island 5 can be significantly improved. Further, since the separated island region is formed on the n+ buried diffused region 8, the punch-through voltage between the p⁻-type semiconductor substrate 1 and the p-type island 5 can be prevented from occurring.

Figure 5A:
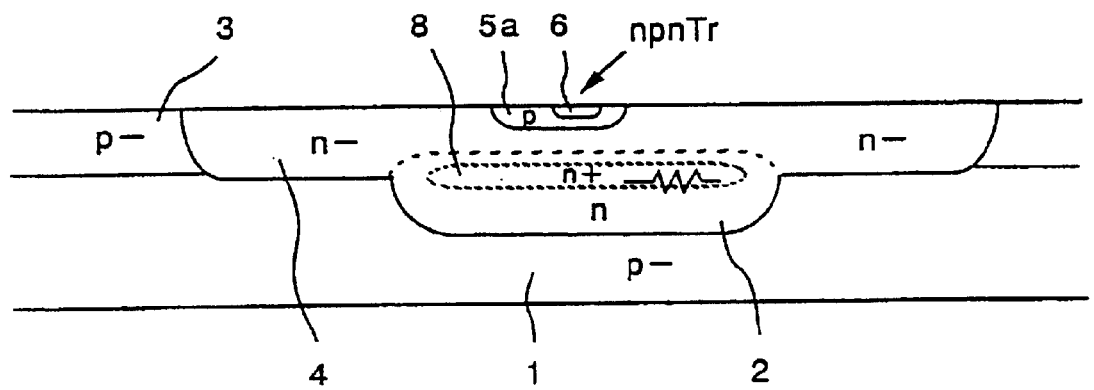
FIG. 5(a) and FIG. 5(b) show a cross-sectional view and a plan view of a vertical npn-Tr on the surface of the structure shown in FIG. 4(a).
Figure 5B:
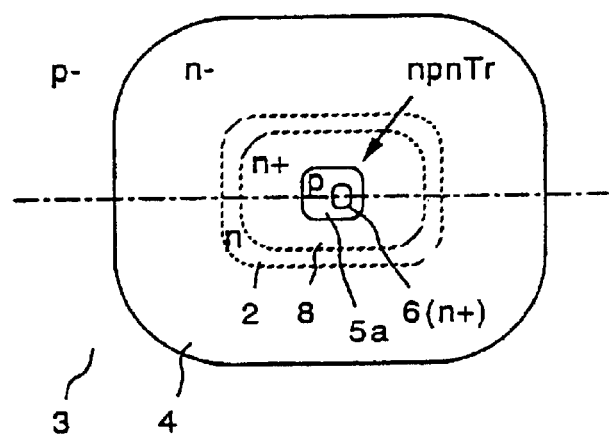

FIG. 5 shows an example in which a base made up of a p-type region 5a and an emitter formed from an n-type diffused region 6 form a vertical npnTr in the surface of an n⁻-type well 4 identical in structure to that shown in FIG. 4. FIG. 5(a) is a cross-sectional view of the example and illustrates a sectional structure taken along the dashed line of the plan view shown in FIG. 5(b).

By this structure, a low resistance region of the n+ buried diffused region 8 can be formed in a portion deeper than the surface in addition to the n⁻-type well 4. Therefore, when a vertical npn-Tr, a vertical nchDMOS, etc. are formed on the n⁻-type well 4, their device characteristics can be improved. Further, this effect obtained in the present embodiment is greater than that obtained in the first embodiment.

Fourth Embodiment

Figure 6A:
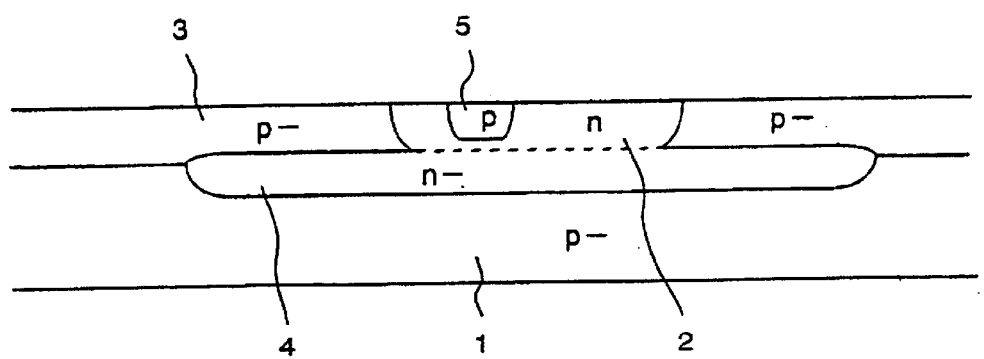
FIG. 6(a) and FIG. 6(b) are a cross-sectional view and a plan view of the structure of a separated island region of a high withstand-voltage employed in a high withstand-voltage semiconductor device according to a fourth embodiment of the present invention.
Figure 6B:
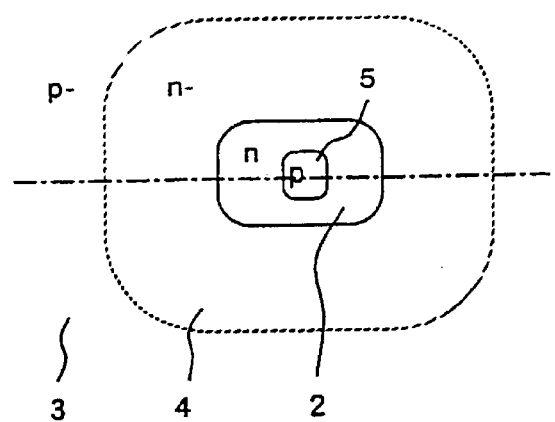

FIG. 6 is a view showing the structure of a separated island region of a high withstand-voltage employed in a high withstand-voltage semiconductor device according to, a fourth embodiment of the present invention. FIG. 6(a) is a cross-sectional view of the separated island region, and FIG. 6(b) is a plan view thereof. FIG. 6(a) is taken along the dashed line of FIG. 6(b).

In FIG. 6, reference numeral 1 indicates a p⁻-type semiconductor substrate (i.e. a first conduction type semiconductor substrate). Reference numeral 4 indicates an n⁻-type well (i.e. an n-type buried region or a second conduction type well relatively low in impurity density) formed on the surface of the p⁻-type semiconductor substrate 1. Reference numeral 3 indicates a p-type epitaxial region 3 (i.e. a first conduction type epitaxial region) formed on the p⁻-type semiconductor substrate 1 including the n-type well 4. Reference numeral 2 indicates an n-type well 2 (i.e. a second conduction type well relatively high in impurity density) formed in the p⁻-type epitaxial region 3 so as to overlap with a partial region of the n-type well 4 and reach the n⁻-type well 4. Reference numeral 5 indicates a p-type island which is formed in the surface of the n-type well 2 at a portion above the n⁻-type well 4 and serves as a back gate region of an nchMOS transistor.

Further, both the n⁻-type well 4 widely extending in the horizontal direction and the p⁻-type epitaxial region 3 being in contact therewith are respectively provided so as to be depleted upon application of a reverse bias thereto and make a RESURF operation. Thus, the separated island region can withstand a high voltage owing to the above provision.

The present embodiment is constructed as described above, so that the separated island region can be formed deep by the thickness of the p⁻-type epitaxial region 3. Therefore, a punch-through voltage between the p⁻-type semiconductor substrate 1 and the p-type island 5 can be greatly improved.

Meanwhile, this embodiment may be summarized as follows. A semiconductor device having a separation structure for high withstand-voltage comprises a first-conduction-type semiconductor substrate and a second-conduction-type well relatively low in impurity density, formed on the surface of the first-conduction-type semiconductor substrate. A first-conduction-type epitaxial region is formed on the first-conduction-type semiconductor substrate including the second-conduction-type well. Further, a second-conduction-type well relatively high in impurity density is formed in the first-conduction-type epitaxial region so as to reach the second-conduction-type well relatively low in impurity density within a partial region of the second-conduction-type well relatively low in impurity density.

Further, in the semiconductor device, circuit elements are formed in the second-conduction-type well relatively high in impurity density.

Fifth Embodiment

Figure 7A:
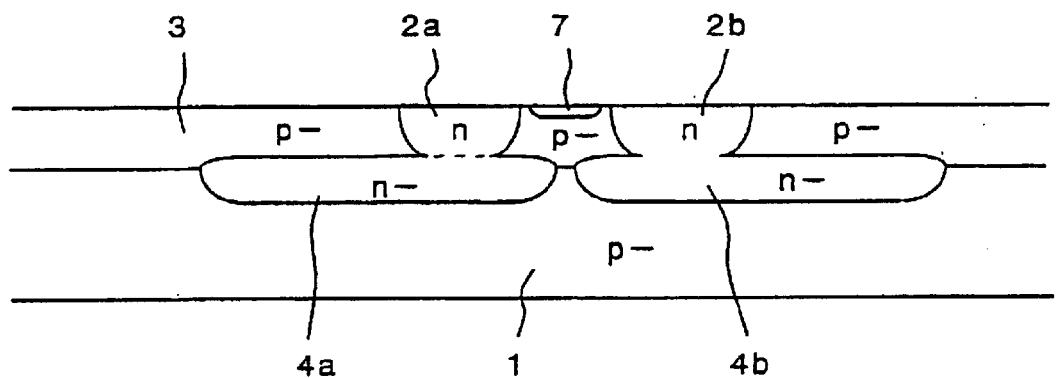
FIG. 7(a) and FIG. 7(b) are a cross-sectional view and a plan view of the structure of a separated island region of a high withstand-voltage employed in a high withstand-voltage semiconductor device according to a fifth embodiment of the present invention.
Figure 7B:
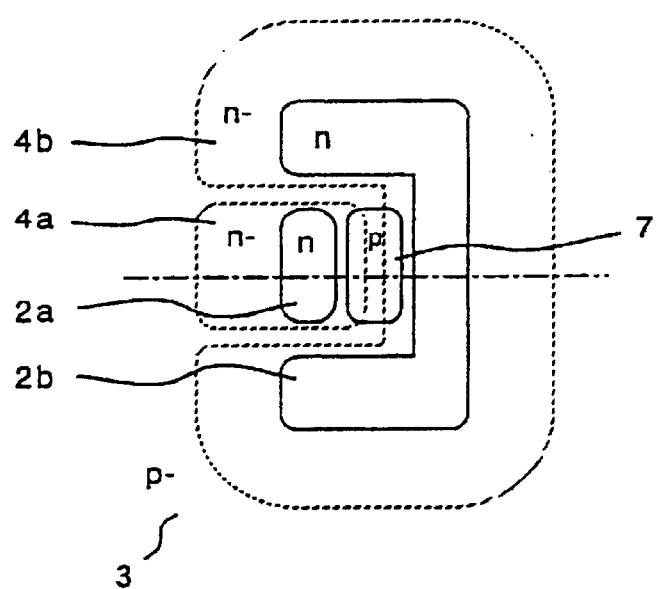

FIG. 7 is a view showing the structure of a separated island region of a high withstand-voltage employed in a high withstand-voltage semiconductor device according to a fifth embodiment of the present invention. FIG. 7(a) is a sectional view of the separated island region, and FIG. 7(b) is a plan view thereof. FIG. 7(a) is taken along the dashed line of FIG. 7(b).

The fifth embodiment is one in which the island region employed in the fourth embodiment is divided into partial form. Namely, the n-type well 4 is divided into two parts, disposed with a predetermined interval defined therebetween. The n-type well 2 is also divided into two parts, spaced away from each other so that a p-type epitaxial region 3 appears in the center thereof. The divided n-type wells 4 are entirely spread so as to extend to the outer peripheral portions of the divided n-type wells 2.

Described more specifically, in the high withstand-voltage separation structure according to the present embodiment, first and second n-type wells 4a and 4b (i.e. second conduction type wells relatively low in impurity density) are formed in a p-type semiconductor substrate 1 (i.e. a first conduction type semiconductor substrate). The p-type epitaxial region 3 (i.e. a first conduction type epitaxial region) is formed on the p⁻type semiconductor substrate 1 including the first and second n⁻-type wells 4a and 4b. Further, first and second n-type wells 2a and 2b (second conduction type wells relatively high in impurity density) are formed in the p⁻-type epitaxial region 3 so as to reach the first and second n⁻-type wells 4a and 4b on partial regions of the first and second n-type wells 4a and 4b. The first and second n-type wells 4a and 4b are formed so as to extend to an outer peripheral portion of a region including the first and second n-type wells 2a and 2b. Namely, the first and second n-type wells 4a and 4b are formed so as to surround the outer peripheries of the first and second n-type wells 2a and 2b as a whole, as seen from the plan view of FIG. 7(b).

The first and second n⁻-type wells 4a and 4b are spaced apart from each other by such a distance as capable of obtaining a punch-through voltage greater than an island withstand voltage.

Further, a reversal-preventive p-type diffused region 7 is formed on the surface of the p⁻-type epitaxial region 3 developed between the n-type wells 2a and 2b.

If punch-through is reached between the first and second n⁻-type wells 4a and 4b at a voltage lower than a surface junction withstand voltage between the n-type wells 2a, 2b and the p-type diffused region 7, when a reverse bias is applied between the p⁻-type semiconductor substrate 1 and the island in this construction, then the withstand voltage is not reduced due to the separation structure. Thus, even when the reversal-preventive p-type diffused region 7 is formed on the surface of the p⁻-type epitaxial region 3, a structure free of the occurrence of a reduction in island withstand voltage can be obtained. Namely, this structure serves so as to prevent a reduction in withstand voltage at the surface owing to a JFET effect produced between the first and second n⁻-type wells 4a and 4b.

The present embodiment is of such a construction that the separated island region can be formed deep by the thickness of the p-type epitaxial region 3. Therefore, the punch-through voltage between the p⁻-type semiconductor substrate 1 and, for example, the p-type island 5 can be greatly improved.

Meanwhile, this embodiment may be summarized as follows. A semiconductor device having a separation structure for high withstand-voltage comprises a first-conduction-type semiconductor substrate and first and second second-conduction-type wells relatively low in impurity density, formed on the surface of the first-conduction-type semiconductor substrate, disposed with a predetermined distance therebetween. A first-conduction-type epitaxial region is formed on the first-conduction-type semiconductor substrate including the first and second second-conduction-type wells. Further, first and second second-conduction-type wells relatively high in impurity density are formed, spaced a predetermined distance from each other, in the first-conduction-type epitaxial region so as to reach the second-conduction-type wells relatively low in impurity density within a partial area of the first and second second-conduction-type wells relatively low in impurity density.

Further, in the semiconductor device, a first-conduction-type region relatively high in impurity density is formed in the surface of said first-conduction-type epitaxial region interposed between said first and second second-conduction-type wells relatively high in impurity density.

Further, in the semiconductor device, circuit elements are formed in the second-conduction-type well relatively high in impurity density.

Sixth Embodiment

Figure 8A:
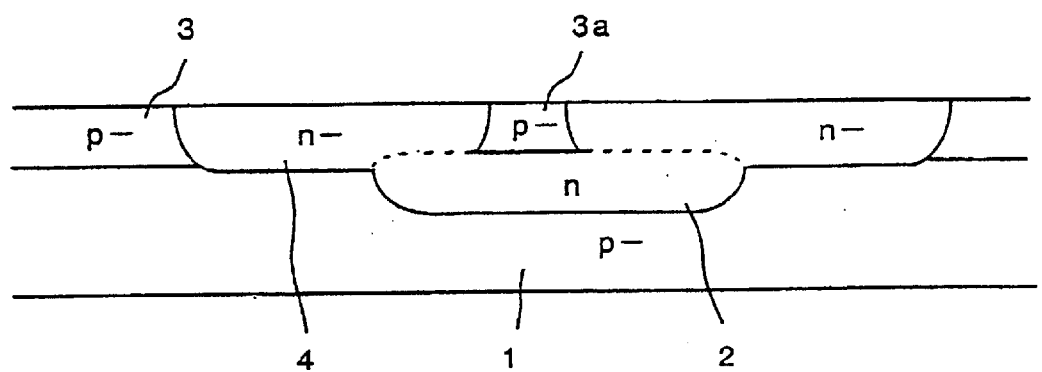
FIG. 8(a) and FIG. 8(b) are a cross-sectional view and a plan view of the structure of a separated island region of a high withstand-voltage employed in a high withstand-voltage semiconductor device according to a sixth embodiment of the present invention.
Figure 8B:
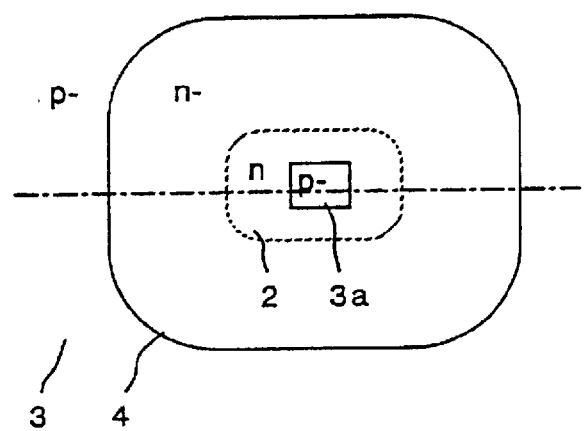
Figure 9A:
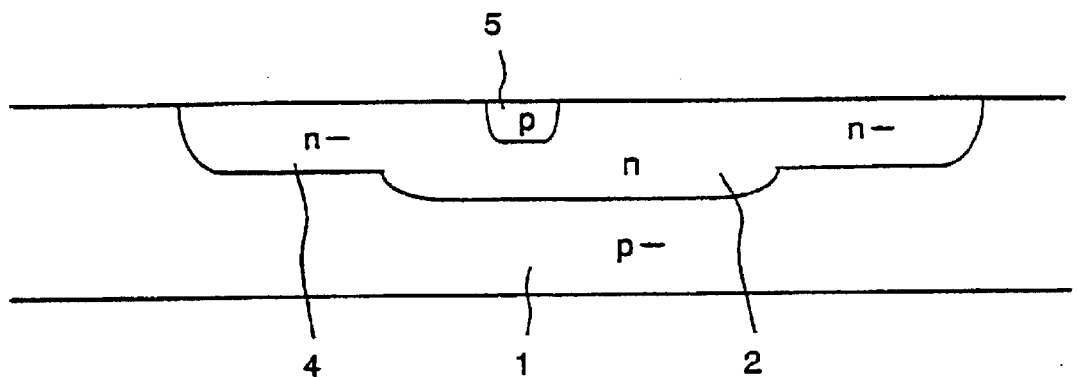
FIG. 9(a) and FIG. 9(b) are a cross-sectional view and a plan view of the structure of a separated island region using a RESURF structure of high withstand-voltage in a conventional high withstand-voltage semiconductor device.
Figure 9B:
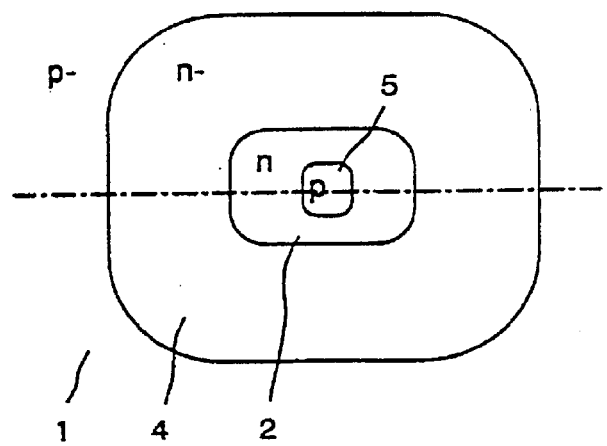
Figure 10A:
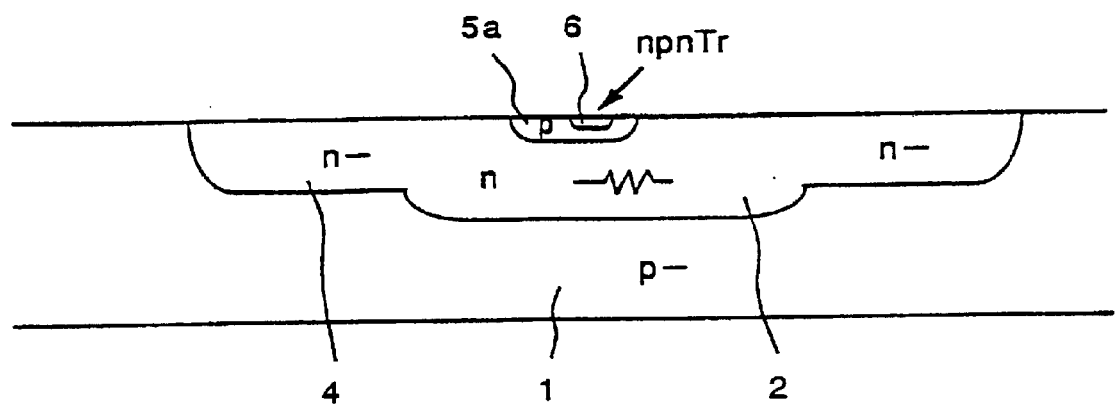
FIG. 10(a) and FIG. 10(b) show a cross-sectional view and a plan view of a vertical npn-Tr on the surface of the structure shown in FIG. 9(a).
Figure 10B:
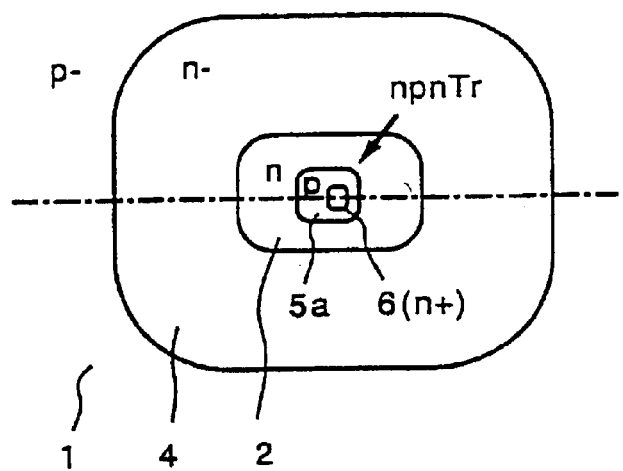
Figure 11A:
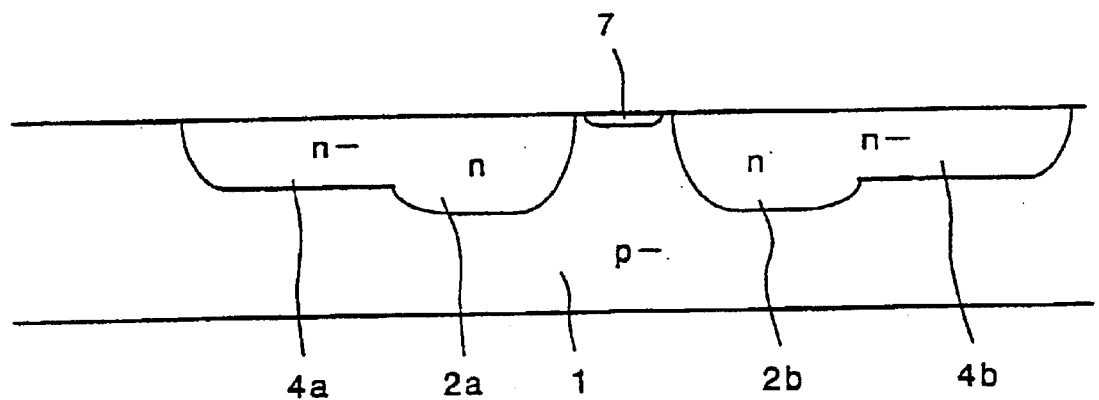
FIG. 11(a) and FIG. 11(b) are a cross-sectional view and a plan view of a structure of a separated island region using a RESURF structure of high withstand-voltage in another conventional high withstand-voltage semiconductor device.
Figure 11B:
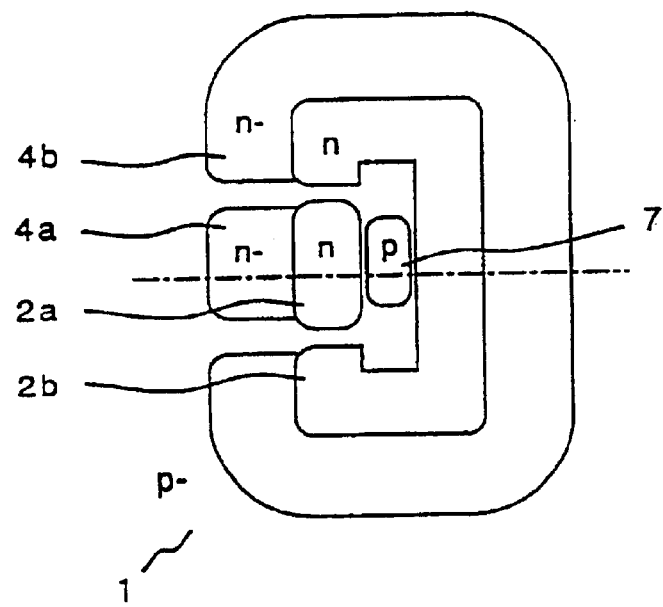

FIG. 8 is a view showing a structure of a separated island region of a high withstand-voltage employed in a high withstand-voltage semiconductor device according to a sixth embodiment of the present invention. FIG. 8(a) is a sectional view of the separated island region, and FIG. 8(b) is a plan view thereof. FIG. 8(a) is taken along the dashed line of FIG. 8(b).

The sixth embodiment is one in which a region corresponding to the p-type island 5 employed in the first embodiment is formed by leaving a p-type epitaxial region 3a behind.

Described more specifically, in the high withstand-voltage separation structure according to the present embodiment, an n-type well 2 (i.e. a second conduction type well relatively high in impurity density) is formed in a p⁻-type semiconductor substrate 1 (i.e. a first conduction type semiconductor substrate). The p⁻-type epitaxial region 3 (i.e. a first conduction type epitaxial region) is formed on the p-type semiconductor substrate 1 including the n-type well 2. Further, an n⁻-type well 4 (i.e. a second conduction type well relatively low in impurity density) is formed in the p⁻-type epitaxial region 3 so as to reach the n-type well 2 in a region including the n-type well 2 except for a predetermined portion on the n-type well 2. Thus, a portion 3a of the p⁻-type epitaxial region 3 is left on the n-type well 2 as an island. This can be used in a manner similar to the p-type island 5 shown in FIG. 1.

The range of resistivity of the p⁻-type semiconductor substrate 1 is limited to ensure its withstand voltage, whereas the range of resistivity of the p⁻-type epitaxial region 3 is not much limited because it exists only on the surface region. Thus, a structure can be easily implemented as shown in FIG. 8, wherein the p⁻-type epitaxial region 3 is set at a lower resistivity than the p-type semiconductor substrate 1 so that it can be used as the island, and one mask can be reduced or cut in manufacturing. In this case, the resistivity of the p-type epitaxial region 3 can be set according to, for example, a CMOS characteristic.

By such a structure, the separated island region can be formed deep by the thickness of the p-type epitaxial region 3. Therefore, the punch-through voltage between the p⁻-type semiconductor substrate 1 and the p⁻-type epitaxial region 3a used as the island can be greatly improved.

Further, the high-density region made up of the n-type well 2 is formed in a region beneath the surface. Therefore, when a vertical npnTr, a vertical nchDMOS, etc. are; formed in the surface of the n⁻-type well 4, device characteristics can be improved.

The effects and advantages of the present invention are summarized as follows.

In a high withstand-voltage semiconductor device according to the present invention, an epitaxial region having a desired thickness is formed on a semiconductor substrate and a high withstand-voltage separated island region is formed using the epitaxial region. Therefore, punch-through to an island formed within an island region can be controlled.

In a high withstand-voltage semiconductor device according to the present invention, since a region relatively high in impurity density is formed in a portion below an island region, the diffusion resistance of a lower portion of a vertical device such as a vertical npnTr, a vertical nchDMOS or the like can be lowered when the vertical device is incorporated into the island region, whereby the characteristic of the vertical device can be improved.

Further, in a high withstand-voltage semiconductor device according to the present invention, a structure can be obtained wherein even when a diffused region for reversal prevention is added to the surface thereof when a high withstand-voltage separated island region is divided into parts for isolation between devices, the withstand voltage of the island region is not affected by its addition.

Moreover, according to the present invention, a portion of an epitaxial region formed on a semiconductor substrate to a predetermined thickness can be left within a high withstand-voltage separated island region and set to a suitable resistivity. The epitaxial region can then be used as an island. Thus, the formation of an island diffused region can be omitted and manufacturing can be simplified.

Obviously many modifications and variations of the present invention are possible in the light of the above teachings. It is therefore to be understood that within the scope of the appended claims the invention may by practiced otherwise than as specifically described.

What is claimed is:

1. A semiconductor device having a separate structure for high withstand-voltage comprising:

a first-conduction-type semiconductor substrate;

first and second second-conduction-type wells relatively high in impurity density, said first and second second-conduction-type wells being formed on a surface of said first-conduction-type semiconductor substrate, said first and second second-conduction-type wells being disposed with a first predetermined distance therebetween;

a first-conduction-type epitaxial region formed on said first-conduction-type semiconductor substrate and above said first and second second-conduction-type wells;

first and second second-conduction-type wells relatively low in impurity density, said first and second second-conduction-type wells being formed, spaced a second predetermined distance each other, in said first-conduction-type epitaxial region at a depth to reach said first and second second-conduction-type well relatively high in impurity density in an area including at least portions of said fist and second second-conduction-type wells relatively low in impurity density being formed to extend substantially beyond an outer peripheral portion of the said first and second second-conduction-type wells relatively high in impurity density and being formed to particularly overlap and incompletely surround said first and second second-conduction-type wells relatively high in impurity density, wherein said second predetermined distance between said first and second second-conduction-type wells relatively low in impurity density is greater than said first predetermined distance between said first and second second-conduction-type wells relatively high in impurity density; and a first-conduction-type region relatively high in impurity density formed ill a surface of said first-conduction-type epitaxial region interposed between said first and second second-conduction type wells relatively low in impurity density.

2. A semiconductor device according to claim 1, wherein circuit elements are formed in said second-conduction-type well relatively low in impurity density.

3. A semiconductor device according to claim 1, wherein said first-conduction-type semiconductor substrate is a p-type silicon semiconductor substrate, said second-conduction-type well relatively high in impurity density is an n-type silicon semiconductor well, said first-conduction-type epitaxial region is an p-type silicon epitaxial region, and said second-conduction-type well relatively low in impurity density is a n⁻-type silicon semiconductor well.

* * * * *